United States Patent [19]

Gobbetti

[11] Patent Number: 5,064,511

[45] Date of Patent: Nov. 12, 1991

[54] ELECTROCHEMICAL GRAINING OF ALUMINUM OR ALUMINUM ALLOY SURFACES

[75] Inventor: Osvaldo Gobbetti, Verona, Italy

[73] Assignee: Diaprint S.r.l., Pescantina, Italy

[21] Appl. No.: 527,904

[22] Filed: May 24, 1990

[30] Foreign Application Priority Data

Jun. 5, 1989 [IT] Italy ................. 84942 A/89

[51] Int. Cl.$^5$ .................. C25D 5/44; C25F 3/04
[52] U.S. Cl. .................. 204/33; 204/129.4; 204/129.5; 204/129.95
[58] Field of Search ............ 204/129.1, 129.4, 129.5, 204/129.75, 129.95, 33

[56] References Cited

U.S. PATENT DOCUMENTS

| | | | |
|---|---|---|---|
| 3,728,237 | 4/1973 | Heijenbrok et al. | 204/129.75 |
| 4,052,275 | 10/1977 | Gumbinner et al. | 204/129.75 X |
| 4,174,269 | 11/1979 | Carlin et al. | 204/129.75 X |
| 4,396,468 | 8/1983 | Walls | 204/129.75 X |
| 4,547,275 | 10/1985 | Ejima et al. | 204/129.75 |

*Primary Examiner*—Donald R. Valentine
*Attorney, Agent, or Firm*—Guido Modiano; Albert Josif

[57] ABSTRACT

Aluminum or its alloys are electrochemically grained by using alternate current and an aqueous electrolyte comprising specific amounts of hydrochloric acid and an oxy-acid and/or a dicarboxylic acid, preferably lactic acid and/or succinic acid, respectively. Aluminum (or an alloy thereof) thus grained, can be coated with a photosensitive layer whereby forming a printing plate. Before coating it with the photosensitive layer, the plate can also be anodized by techniques well known to those skilled in the art.

24 Claims, No Drawings

ELECTROCHEMICAL GRAINING OF ALUMINUM OR ALUMINUM ALLOY SURFACES

BACKGROUND OF THE INVENTION

The present invention relates to the techniques of graining an aluminum surface by using alternate current and suitable electrolytes for preparing printing matrixes.

As is known, in the field of the aluminum surface treatment, better known as graining, such technique consists of roughening the metal surface, so as to condition it, on the one hand, for retaining the photosensitive layer which will thus better adhere to the substrate during the printing stage, and on the other hand, for retaining water in the non-printing areas. The principle of the offset printing is based on the chemical-physical equilibrium between hydrophilic and hydrophobic parts and the basis of such equilibrium is established by a good technique of roughening the metal substrate surface.

By a "good roughening technique" is meant a technique capable of uniformly acting on the aluminum surface, so as to create a series of holes evenly spaced apart one from the other, having a frequency per unit surface as high as possible, and depths as homogeneous as possible. The reason of these requirements resides in the fact that the higher is the frequency of the holes produced by graining, the higher will be the adhesion of the photosensitive layer on the metal and thus the number of copies which the printing plate will be capable of producing. Moreover, for the same reason the higher will be the wettability with water of the nonprinting areas.

This will obviously contribute in the utmost manner to the separation of the lipophilic portion, i.e. printing portion, and hydrophilic non-printing portion. This because during the printing stage the ink will be fixed on the lipophilic areas which, as said, form the photosensitive layer.

Another very important parameter, at the same frequency of number of holes produced per unit surface, consists of the average depth of the same. In this respect it is to be stated that the manufacturers of printing plates try to reach a compromise between shallow holes which produce the so called fine grain, allow for a better reproduction of the image to be printed, require minor amounts of water, but which at the same time loose more easily the veil of absorbed water with the risk of forming the so called ink veil, and deep holes which produce the so called coarse grain and which, if on the one hand do not allow for the same good reproduction as the fine grain, allow for a greater wettability of the non-printing areas and, at the end, for a greater reliability for the printer.

The depth of the holes produced in the graining stage is measured with an apparatus called "roughness-meter" (profilemeter) having a very sensitive tip which is passed on the coarsened surface. The signal recorded by this tip is electronically amplified and gives a measure of the hole depth.

The most widely used value for the roughness measurement is Ra (average roughness) which indicates the average of the distances of the surface profile above and below a reference line defined as a line so drawn that the sum of the areas encompassed by the surface profile above the line is equal to the sum of those below the line.

Ra is normally measured in microns (micro-meters).

Now, as is known to those skilled in the art, the above disclosed coarsening effect, better known as graining, can be obtained with a simple aqueous solution of hydrochloric acid (HCl) with concentrations ranging from 3g/l to 15g/l, by passing alternate current between the aluminum plate and a counter-electrode thereof at a current density of 2 to 5 Ampere/sq.dm for 30" to 120".

Actually, by varying the various cited parameters it is lo possible to obtain with this system a variation of the depth of the graining holes, but in order to obtain an acceptable homogeneity of the surface it is necessary to monitor very carefully the concentration of the acid and of the dissolved aluminum which is present in chloride form. Besides, at the lower concentration limits of HCl the obtained grain is fine, but there are ample areas completely and inhomogeneously flat. At high concentrations, the coarsening homogeneity is greater, but there are great probabilities of metal "dust" being formed which is then difficult to remove.

Mixed electrolytes, such as HCl and phosphoric acid, give better results, in that a lower Ra value and higher homogeneity can be obtained, but they raise rather big problems of formation of black aluminum metal powder, just called "dust" in the field.

Another electrolyte used with good results is nitric acid which however presents serious problems of environment polution in so far as treatment of gaseous and liquid effluents is concerned.

Certain patents, see GB 1598701, cite instead electrolytes still comprising hydrochloric acid and also comprising monocarboxylic acids with 1 to 4 carbon atoms.

According to that patent the grain thus obtained is more satisfactory, can be better controlled in view of obtaining increasing values on Ra scale, and is more homogeneous than that produced through previously known techniques, however the electrolytes involved smell disagreeably and are thus undesirable from a hygienic point of view.

SUMMARY OF THE INVENTION

An object of the present invention is to provide aqueous electrolyte solutions which allow to obtain an even finer grading in the roughness values Ra than obtainable with the above mentioned known processes.

A further object of this invention is to provide aqueous solutions of electrolytes based on compounds which are generally in powder form and are far less polluting, at least from the point of view of their smell, than are the solutions of carboxylic acids.

According to a first feature of this invention an aqueous solution of electrolytes is provided comprising hydrochloric acid in a concentration of 2.5 to 20 g/l and at least one acid selected from the group of oxy-acids, dicarboxylic acids and their derivatives, and mixtures thereof, in a concentration of 1 to 100 g/l.

Advantageously the oxy-acids comprise: glycolic, lactic, alpha-oxy-butyric, mandelic, glyceric, malic, tartaric, mesotartaric, citric acids.

The dicarboxylic acids and their derivatives comprise: oxalic, malonic, succinic, glutaric, adipic, pimelic, suberic, azelaic, sebacic, maleic, fumaric, phthalic, isophthalic, terephthalic, hemimellitic, trimellitic, trimesic acids, and succinic, maleic and phthalic anhydride.

According to another feature of this invention a process of surface roughening or graining is provided which comprises electrolytically treating aluminum plates in an aqueous solution of electrolytes, as mentioned above, by passing alternate current at a voltage of 5 to 42 Volts, preferably 10 to 30 Volts, and a current density of 1.5 to 10 Ampere/sq. dm, for a duration of 30" to 5' and with a distance between the plate and electrode ranging from 10 to 250 mm and at a temperature comprised between 10° and 40°, preferably between 15° and 30° C.

Advantageously, once a metal plate or matrix has been treated in accordance with the above disclosed process, it can be anodized in aqueous solutions containing sulfuric, phosphoric, oxalic or other acids, singularly or in various combinations one with the other, according to a technique already widely known, and can be coated with photosensitive layers, as is known to those skilled in the art.

The invention is further illustrated by the following examples of practical embodiments thereof.

EXAMPLE 1

Two sheets each having a surface of 3 sq.dm, made of an aluminum alloy consisting of 99.52% aluminum, 0.11% silicium, 0.32% iron, 0.018% copper, 0.006% manganese, 0.001% chromium, 0.003% nickel, 0.005% zinc, 0.019 % titanium, were immersed in an aqueous solution comprising hydrochloric acid at a concentration of 10 g/l and citric acid at a concentration of 20 g/l. The distance between the two sheets was of 160 nm. Current has been applied for 2'with the following results.

| VOLT | AMPERE/DMQ | Ra (μ) | SURFACE APPEARANCE |
|---|---|---|---|
| 15 | 5,1 | 0,42 | FINE, SUFFICIENTLY HOMOGENEOUS GRAIN |
| 18 | 6,3 | 0,70 | MEDIUM GRAIN, WELL-HOMOGENEOUS |
| 21 | 7 | 0,85 | SUFFICIENTLY COARSE AND HOMOGENEOUS GRAIN |

EXAMPLE 2

Two sheets of aluminum alloy having the composition of Example1, were immersed in an aqueous solution comprising hydrochloric and glycolic acids, by placing them at a mutual distance of 200 mm, and were electrochemically grained for 1'45" with the following results:

| CONCEN-TRATIONS | VOLT | AMPERE/DMQ | Ra (μ) | SURFACE APPEARANCE |
|---|---|---|---|---|
| HCl 12 g/l Lactic acid 10 g/l | 18 | 4,2 | 0,53 | FINE AND HOMOGENEOUS GRAIN |
| HCl 12 g/l glycolic acid 20 g/l | 18 | 7,8 | 0,77 | MEDIUM, VERY HOMOGENEOUS GRAIN |
| HCl 12 g/l glycolic acid 20 g/l | 20 | 9,1 | 0,92 | COARSE, VERY HOMOGENEOUS GRAIN |

EXAMPLE 3

Two sheets of aluminum alloy consisting of 97.98% aluminum, 0.30% silicium, 0.54% iron, 0.006% copper, 1.15% manganese, 0.002% magnesium, 0.003% chromium, 0.005% zinc, 0.009% titanium, were placed in an aqueous solution containing hydrochloric and lactic acids, at a mutual distance of 180 mm. Alternate current was passed for 2'3", with the following results:

| CONCEN-TRATIONS | VOLT | AMPERE/DMQ | Ra (μ) | SURFACE APPEARANCE |
|---|---|---|---|---|
| HCl 3,5 g/l lactic acid 10 g/l | 20 | 2,1 | 0,32 | VERY FINE GRAIN, FAIRLY HOMOGENEOUS |
| HCl 3,5 g/l lactic acid 20 g/l | 20 | 2,7 | 0,55 | FINE GRAIN, WELL HOMOGENEOUS |
| HCl 10 g/l lactic acid 40 g/l | 20 | 6,5 | 0,63 | MEDIUM GRAIN, EXCEPTIONALLY HOMOGENEOUS |

EXAMPLE 4

Two sheets of aluminum of the same composition as in Example 3, were placed in an aqueous solution containing hydrochloric and succinic acids, at a mutual distance of 160 mm. Alternate current was passed for 2', with the following results:

| CONCEN-TRATIONS | VOLT | AMPERE/DMQ | Ra (μ) | SURFACE APPEARANCE |
|---|---|---|---|---|
| HCl 10 g/l Succinic acid 10 g/l | 18 | 6,5 | 0,54 | FAIRLY FINE GRAIN, VERY HOMOGENEOUS |
| HCl 10 g/l succinic acid 20 g/l | 18 | 8,5 | 0,69 | MEDIUM, VERY HOMOGENEOUS GRAIN |
| HCl 10 g/l succinic acid 40 g/l | 18 | 11,2 | 0,71 | MEDIUM GRAIN, EXCEPTIONALLY HOMOGENEOUS |

EXAMPLE 5

Two sheets of aluminum alloy consisting of 98.55% aluminum, 0.066% silicium, 0.67% iron, 0.070% copper, 0.004% manganese, 0.60% magnesium, 0.001% chromium, 0.004% nickel, 0.006% zinc, 0.024% titanium, were put in an aqueous solution containing hydrochloric, lactic and succinic acids, at a mutual distance of 200 mm. Alternative current was passed for 1'25", with the following results:

| CONCEN-TRATIONS | VOLT | AMPERE/DMQ | Ra (μ) | SURFACE APPEARANCE |
|---|---|---|---|---|
| HCl 12 g/l lactic acid 10 g/l succinic acid 5 g/l | 21 | 5,3 | 0,51 | ENOUGH FINE AND HOMOGENEOUS |
| HCl 12 g/l lactic acid 10 g/l succinic acid 10 g/l | 21 | 7,4 | 0,67 | MEDIUM, VERY HOMOGENEOUS GRAIN |
| HCl 12 g/l lactic acid 10 g/l succinic acid 10 g/l | 25 | 8,8 | 0,77 | RATHER COARSE GRAIN, VERY HOMOGENEOUS |

In examples 1 to 5 the Ra values have been determined by using a Taylor Hobson Subtronic 3P (Denmark) profilemeter (roughness-meter).

After its electrolytical treatment the plate, "grained" as specified above, can be subjected to an anodization process by passing direct current through a further aqueous electrolyte solution, such as of sulfuric acid, phosphoric acid, oxalic acid, or a mixture thereof.

Finally the so anodized plate can be coated with a photosensitive layer, as commonly practised in the field.

I claim:

1. An electrolyte for electrolytically graining aluminum or aluminum alloys comprising an aqueous solution of hydrochloric acid in a concentration ranging from 2.5 to 20 g/l and at least one further acid selected from at least an oxy-acid, at least a dicarboxylic acid or its derivatives, and their mixtures, at a concentration of 1 to 100 g/l, wherein said dicarboxylic acid is selected from the group comprising oxalic, malonic, succinic, glutaric, adipic, pimelic, suberic, azelaic, sebacic, maleic, fumaric, phthalic, isophthalic, hemimellitic, trimellitic and trimesic acids.

2. An electrolyte according to claim 1, wherein said oxy-acid is selected from the group comprising glycolic, lactic, alpha-oxy-butyric, mandelic, glyceric malic, tartaric, mesotartaric and citric acids.

3. An electrolyte according to claim 1, wherein said oxy-acid is selected from the group comprising glycolic, lactic and citric acids.

4. An electrolyte for electrolytically graining aluminum or aluminum alloys comprising an aqueous solution of hydrochloric acid in a concentration ranging from 2.5 to 20 g/l and at least one further acid selected from at least an oxy-acid, at least a dicarboxylic acid or its derivatives, and their mixtures, at a concentration of 1 to 100 g/l, wherein said derivative of a dicarboxylic acid is selected from the group comprising succinic, maleic and phthalic anhydrides.

5. An electrolyte according to claim 4, wherein said oxy-acid is selected from the group comprising glycolic, lactic, alpha-oxy-butyric, mandelic, glyceric, malic, tartaric, mesotartaric and citric acids.

6. An electrolyte according to claim 4, wherein said oxy-acid is selected from the group comprising glycolic, lactic and citric acids.

7. An electrolyte for electrolytically graining aluminum or aluminum alloys comprising an aqueous solution of hydrochloric acid in a concentration ranging from 2.5 to 20 g/l and at least an oxy-acid and a dicarboxylic acid or its derivatives at a concentration of 1 to 100 g/l, wherein said dicarboxylic acid is selected from the group comprising oxalic, malonic, succinic, glutaric, adipic, pimelic, suberic, azelaic, sebacic, maleic, fumaric, phthalic, isophthalic, hemimellitic, trimellitic and trimesic acids.

8. An electrolyte according to claim 7, wherein said oxy-acid is selected from the group comprising glycolic, lactic, alpha-oxy-butyric, mandelic, glyceric, malic, tartaric, mesotartaric and citric acids.

9. An electrolyte according to claim 7, wherein said oxy-acid is selected from the group comprising glycolic, lactic and citric acids.

10. An electrolyte for electrolytically graining aluminum or aluminum alloys comprising an aqueous solution of hydrochloric acid in a concentration ranging from 2.5 to 20 g/l and at least an oxy-acid and a dicarboxylic acid or its derivatives at a concentration of 1 to 100 g/l, wherein said derivative of a dicarboxylic acid is selected from the group comprising succinic, maleic and phthalic anhydrides.

11. An electrolyte according to claim 10, wherein said oxy-acid is selected from the group comprising glycolic, lactic, alpha-oxy-butyric, mandelic, glyceric, malic, tartaric, mesotartaric and citric acids.

12. An electrolyte according to claim 10, wherein said oxy-acid is selected from the group comprising glycolic, lactic and citric acids.

13. An electrolyte for electrolytically graining aluminum for aluminum alloys comprising an aqueous solution of hydrochloric acid in a concentration ranging from 2.5 to 20 g/l and at least a dicarboxylic acid or its derivatives at a concentration of 1 to 100 g/l, wherein said dicarboxylic acid is selected from the group comprising oxalic, malonic, succinic, glutaric, adipic, pimelic, suberic, azelaic, sebacic, maleic, fumaric, phthalic, isophthalic, hemimellitic, trimellitic and trimesic acids.

14. An electrolyte for electrolytically graining aluminum or aluminum alloys comprising an aqueous solution of hydrochloric acid in a concentration ranging from 2.5 to 20 g/l and at least a dicarboxylic acid or its derivatives at a concentration of 1 to 100 g/l, wherein said derivative of a dicarboxylic acid is selected from the group comprising succinic, maleic and phthalic anhydrides.

15. A process of surface roughening or graining comprising electrolytically treating one or more aluminum plates in an aqueous solution of electrolytes, said solution comprising hydrochloric acid in a concentration ranging from 2.5 to 20 g/l and at least one further acid selected from at least an oxy-acid, at least a dicarboxylic acid or its derivatives, and their mixtures, at a concentration of 1 to 100 d/l, wherein said dicarboxylic acid is selected from the group comprising oxalic, malonic, succinic, glutaric, adipic, pimelic, suberic, azelaic, sebacic, maleic, fumaric, phthalic, isophthalic, hemimellitic, trimellitic and trimesic acids, said treating being carried out by applying alternate current at a voltage of 5 to 42 volts, preferably 10 to 30 volts, at a current density of 1.5 to 10 Ampere/sq. dm for a duration ranging from 30" to 5', and at a temperature ranging from 10° to 40° C., preferably from 15° to electrode ranging from 10 to 250 mm.

16. A process according to claim 15, comprising a stage of anodization of the grained plate comprising immersing the plate in an anodizing bath comprising an anodization electrolyte selected from sulfuric, phosphoric, oxalic acids, and a mixture thereof, and passing direct current through the bath.

17. A process according to claim 16, comprising a stage of coating the anodized plate with at least a photosensitive layer.

18. A process of surface roughening or graining comprising electrolytically treating one or more aluminum plates in an aqueous solution of electrolytes, said solution comprising hydrochloric acid in a concentration ranging from 2.5 to 20 g/l and at least one further acid selected from at least an oxy-acid, at least a dicarboxylic acid or its derivatives, and their mixtures, at a concentration of 1 to 100 g/l, wherein said derivative of a dicarboxylic acid is selected from the group comprising succinic, maleic and phthalic anhydrides, said treating being carried out by applying alternate current at a voltage of 5 to 42 volts, preferably 10 to 30 volts, at a current density of 1.5 to 10 Ampere/sq. dm for a duration ranging from 30" to 5', and at a temperature ranging from 10° to 40° C., preferably from 15° to 30°, the distance between the plate and a respective electrode ranging from 10 to 250 mm.

19. A process according to claim 18, comprising a stage of anodization of the grained plate comprising immersing the plate in an anodizing bath comprising an anodization electrolyte selected from sulfuric, phosphoric, oxalic acids, and a mixture thereof, and passing direct current through the bath.

20. A process according to claim 19, comprising a stage of coating the anodized plate with at least a photosensitive layer.

21. A process of surface roughening or graining comprising electrolytically treating one or more aluminum plates in an aqueous solution of electrolytes, said solution comprising hydrochloric acid in a concentration ranging from 2.5 to 20 g/l and at least an oxy-acid and a dicarboxylic acid or its derivatives at a concentration of 1 to 100 g/l, wherein said dicarboxylic acid is selected from the group comprising oxalic, malonic, succinic, glutaric, adipic, pimelic, suberic, azelaic, sebacic, maleic, fumaric, phthalic, isophthalic, hemimellitic, trimellitic and trimesic acids, said treating being carried out by applying alternate current at a voltage of 5 to 42 volts, preferably 10 to 30 volts, at a current density of 1.5 to 10 Ampere/sq. dm for a duration ranging from 30" to 5', and at a temperature ranging from 10° to 40° C., preferably from 15° to 30°, the distance between the plate and a respective electrode ranging from 10 to 250 mm.

22. A process of surface roughening or graining comprising electrolytically treating one or more aluminum plates in an aqueous solution of electrolytes, said solution comprising hydrochloric acid in a concentration ranging from 2.5 to 20 g/l and at least an oxy-acid and a dicarboxylic acid or its derivatives at a concentration of 1 to 100 g/l, wherein said derivative of a dicarboxylic acid is selected from the group comprising succinic, maleic and phthalic anhydrides, said treating being carried out by applying alternate current at a voltage of 5 to 42 volts, preferably 10 to 30 volts, at a current density of 1.5 to 10 Ampere/sq. dm for a duration ranging from 30" to 5', and at a temperature ranging from 10° to 40° C., preferably from 15° to 30°, the distance between the plate and a respective electrode ranging from 10 to 250 mm.

23. A process of surface roughening or graining comprising electrolytically treating one or more aluminum plates in an aqueous solution of electrolytes, said solution comprising hydrochloric acid in a concentration ranging from 2.5 to 20 g/l and at least a dicarboxylic acid or its derivatives at a concentration of 1 to 100 g/l, wherein said dicarboxylic acid is selected from the group comprising oxalic, malonic, succinic, glutaric, adipic, pimelic, suberic, azelaic, sebacic, maleic, fumaric, phthalic, isophthalic, hemimellitic, trimellitic and trimesic acids, said treating being carried out by applying alternate current at a voltage of 5 to 42 volts, preferably 10 to 30 volts, at a current density of 1.5 to 10 Ampere/sq.dm for a duration ranging from 30" to 5', and at a temperature ranging from 10° to 40° C., preferably from 15° to 30°, the distance between the plate and a respective electrode ranging from 10 to 250 mm.

24. A process of surface roughening or graining comprising electrolytically treating one or more aluminum plates in an aqueous solution of electrolytes, said solution comprising hydrochloric acid in a concentration ranging from 2.5 to 20 g/l and at least a dicarboxylic acid or its derivatives at a concentration of 1 to 100 g/l, wherein said derivative of a dicarboxylic acid is selected from the group comprising succinic, maleic and phthalic anhydrides, said treating being carried out by applying alternate current at a voltage of 5 to 42 volts, preferably 10 to 30 volts, at a current density of 1.5 to 10 Ampere/sq. dm for a duration ranging from 30" to 5', and at a temperature ranging from 10° to 40° C., preferably from 15° to 30°, the distance between the plate and a respective electrode ranging from 10 to 250 mm.

* * * * *